(12) United States Patent
Cheng et al.

(10) Patent No.: US 11,719,739 B2
(45) Date of Patent: Aug. 8, 2023

(54) METHOD FOR TESTING LIFETIME OF SURFACE STATE CARRIER OF SEMICONDUCTOR

(71) Applicant: TONGJI UNIVERSITY, Shanghai (CN)

(72) Inventors: Qian Cheng, Shanghai (CN); Weiya Xie, Shanghai (CN); Ya Gao, Shanghai (CN); Yiming Chen, Shanghai (CN); Yingna Chen, Shanghai (CN); Mengjiao Zhang, Shanghai (CN); Haonan Zhang, Shanghai (CN); Shiying Wu, Shanghai (CN)

(73) Assignee: TONGJI UNIVERSITY, Shanghai (CN)

( * ) Notice: Subject to any disclaimer, the term of this patent is extended or adjusted under 35 U.S.C. 154(b) by 372 days.

(21) Appl. No.: 17/275,674

(22) PCT Filed: Jul. 6, 2020

(86) PCT No.: PCT/CN2020/100429
§ 371 (c)(1),
(2) Date: Mar. 12, 2021

(87) PCT Pub. No.: WO2021/004430
PCT Pub. Date: Jan. 14, 2021

(65) Prior Publication Data
US 2022/0043049 A1 Feb. 10, 2022

(30) Foreign Application Priority Data
Jul. 9, 2019 (CN) .......................... 201910615736.2

(51) Int. Cl.
*G01R 31/02* (2006.01)
*G01R 31/26* (2020.01)
(Continued)

(52) U.S. Cl.
CPC ..... *G01R 31/2642* (2013.01); *G01N 21/1717* (2013.01); *G01R 31/31721* (2013.01);
(Continued)

(58) Field of Classification Search
CPC ............ G01R 31/2642; G01R 31/2656; G01R 31/2648; G01R 31/2601; G01R 31/40;
(Continued)

(56) References Cited

U.S. PATENT DOCUMENTS

2017/0010242 A1* 1/2017 Safai ..................... G01D 5/268
2020/0340953 A1* 10/2020 Koek .................. G03F 7/70633
2021/0364474 A1* 11/2021 Pacheco ............... G01R 31/303

FOREIGN PATENT DOCUMENTS

CN 101975815 2/2011
CN 102621465 8/2012
(Continued)

OTHER PUBLICATIONS

"International Search Report (Form PCT/ISA/210) of PCT/CN2020/100429", dated Sep. 29, 2020, with English translation thereof, pp. 1-6.

*Primary Examiner* — Raul J Rios Russo
(74) *Attorney, Agent, or Firm* — JCIP Global Inc.

(57) ABSTRACT

A method for testing a lifetime of a surface state carrier of a semiconductor, including the following steps, 1) a narrow pulse light source is used to emit a light pulse, and coupled to an interior of a near-field optical probe, and the near-field optical probe produces a photon-generated carrier on a surface of a semiconductor material under test through excitation. 2) The excited photon-generated carrier is concentrated on the surface of the semiconductor material, and recombination is conducted continuously with a surface state as a recombination center. 3) A change in a lattice constant is produced due to an electronic volume effect, a
(Continued)

stress wave is produced, and a signal of the stress wave is detected in a high-frequency broadband ultrasonic testing mode. 4) Fitting calculation is conducted on the signal of the stress wave to obtain the lifetime of the surface state carrier $\tau_c$.

9 Claims, 2 Drawing Sheets

(51) Int. Cl.
      *G01N 21/17*     (2006.01)
      *G01R 31/40*     (2020.01)
      *G01R 31/42*     (2006.01)
      *G01R 31/317*     (2006.01)
      *H02S 50/10*     (2014.01)
      *H02S 50/00*     (2014.01)
      *H02S 99/00*     (2014.01)

(52) U.S. Cl.
      CPC .............. *G01R 31/40* (2013.01); *G01R 31/42* (2013.01); *G01N 2021/1719* (2013.01); *H02S 50/00* (2013.01); *H02S 50/10* (2014.12); *H02S 99/00* (2013.01)

(58) Field of Classification Search
      CPC .............. G01R 31/42; G01R 31/31721; G01N 21/1717; G01N 2021/1719; G01N 2021/1706; G01N 29/043; G01N 2291/0258; G01N 2291/2697; G01N 29/2418; H02S 50/10; H02S 50/00; H02S 99/00
      USPC ......... 324/71, 378, 403, 415, 425, 500, 537, 324/764.01
      See application file for complete search history.

(56) References Cited

FOREIGN PATENT DOCUMENTS

| | | |
|---|---|---|
| CN | 104094389 | 10/2014 |
| CN | 104359737 | 2/2015 |
| CN | 104819938 | 8/2015 |
| CN | 106680687 | 5/2017 |
| CN | 108983063 | 12/2018 |
| CN | 110470965 | 11/2019 |
| JP | 2011082312 | 4/2011 |

\* cited by examiner

Exciting a light pulse by a narrow pulse light source, and coupling the light pulse to an optical probe after collimation and focusing

Exciting a semiconductor material surface state carrier by near-field light, and conducting surface recombination on the carrier

Causing a change in a lattice constant of a semiconductor material by an electronic volume effect, and producing a pulse stress wave

Detecting a signal of the stress wave of a surface of the semiconductor material

Conducting fitting calculation on a carrier lifetime according to a trailing signal of the stress wave

FIG. 1

METHOD FOR TESTING LIFETIME OF SURFACE STATE CARRIER OF SEMICONDUCTOR

CROSS-REFERENCE TO RELATED APPLICATION

This application is a 371 of international application of PCT application serial no. PCT/CN2020/100429, filed on Jul. 6, 2020, which claims the priority benefit of China application no. 201910615736.2, filed on Jul. 9, 2019. The entirety of each of the above mentioned patent applications is hereby incorporated by reference herein and made a part of this specification.

FIELD OF TECHNOLOGY

The present invention relates to the technical field of semiconductor material testing, and in particular to a method for testing a lifetime of a surface state carrier of a semiconductor.

BACKGROUND

A carrier lifetime has become an important reference for representing a device property and solar cell efficiency as one important parameter of a semiconductor material. Regarding silicon, which is an IV-group elemental semiconductor, a recombination process of a carrier is almost conducted by means of a recombination center in the middle of a forbidden band. In an actual semiconductor device, the perfect lattice periodicity on a surface of the semiconductor material interrupts suddenly, and break of a periodic potential function causes an electron energy state in the forbidden band, which is a surface state. The surface state has a very important influence on characteristics of the semiconductor device, especially, has a very strong influence on a property of a solar cell.

There are many frequently-used carrier lifetime testing methods, such as a direct current photoconductive decay method, a microwave photoconductive decay method and a surface photovoltaic method, which are all used for testing the carrier lifetime during bulk recombination. However, in the actual semiconductor device, the perfect lattice periodicity on the surface of the semiconductor material interrupts suddenly, and the break of the periodic potential function causes the electron energy state in the forbidden band, which is the surface state. The surface state has a very important influence on the characteristics of the semiconductor device, especially, has a very strong influence on the property of the solar cell. At present, there is no good method for testing a lifetime of a surface state carrier yet.

SUMMARY

An objective of the present invention is to overcome the defects in the prior art so as to provide a method for testing a lifetime of a surface state carrier of a semiconductor.

The objective of the present invention may be realized through the following technical solution:

The method for testing the lifetime of the surface state carrier of the semiconductor, including the following steps:

1) using a narrow pulse light source with photon energy higher than a semiconductor forbidden band width to emit a light pulse, coupling the light pulse to an interior of a near-field optical probe through light path collimation, and producing, by the near-field optical probe, a photon-generated carrier on a surface of a semiconductor material under test through excitation;

2) concentrating the excited photon-generated carrier on the surface of the semiconductor material, and conducting recombination continuously with a surface state as a recombination center, wherein a recombination rate is in direct proportion to a carrier concentration and a carrier lifetime;

3) in both carrier excitation and recombination processes in step 1) and step 2), producing a change in a lattice constant due to an electronic volume effect, producing a stress wave, and detecting a signal of the stress wave in a high-frequency broadband ultrasonic testing mode; and 4) conducting fitting calculation on the signal of the stress wave to obtain the lifetime of the surface state carrier $\tau_c$.

In the step 1), a width of the light pulse emitted by the narrow pulse light source is femtosecond-magnitude to nanosecond-magnitude, and is not more than 5 nanoseconds.

In the step 1), the near-field optical probe is a near-field optical probe with a hole or a near-field optical probe without the hole, and the light pulse is coupled to an interior of the near-field optical probe with the hole or a surface of the near-field optical probe without the hole through collimation.

In the step 1), a distance between the near-field optical probe and the surface of the semiconductor material under test is not more than $1/10$ of a wave length of the light pulse.

In the step 1), the photon-generated carrier excited by the near-field optical probe is located at a surface and a subsurface of a semiconductor under test.

In the step 2), when the recombination of the photon-generated carrier, excited by the near-field optical probe, on the surface of the semiconductor under test is conducted, indirect recombination is conducted with the surface state as the center.

In the step 2), the photon-generated carrier still conducts the recombination continuously after light pulse irradiation is finished, till the carrier in the semiconductor material is returned to a balance state.

In the step 3), the signal of the stress wave of the surface of the semiconductor material is detected by means of a high-frequency broadband ultrasonic testing instrument, wherein the high-frequency broadband ultrasonic testing instrument includes an ultrasonic transducer, a laser doppler vibrometer, and a laser interferometer which have a nanosecond resolution.

In the step 4), fitting is conducted on a trailing part of the signal of the stress wave produced on the surface of the semiconductor material through excitation by near-field light to obtain the lifetime of the surface state carrier $\tau_c$, wherein a specific fitting formula is:

$$\frac{\Delta c}{c} = \frac{dE_G}{dP} n = Q\exp\left(-\frac{t}{\tau_c}\right)$$

wherein c is a lattice constant, $\frac{dE_G}{dP}$ is a band gap pressure coefficient, n is an electron-hole pair concentration, Q is a constant coefficient, and t is time.

Compared with the prior art, the present invention has the following advantages that:

the present invention uses the near-field light to irradiate the surface of the semiconductor material to mainly excite the photon-generated carrier on the surface, uses the high-frequency ultrasonic transducer, the laser doppler vibrometer, and the laser interferometer which have the nanosecond resolution to detect the stress wave produced on the surface, can obtain the lifetime of the surface state carrier of the semiconductor after fitting calculation, can eliminate semiconductor bulk recombination influence, and has great significance for a solar cell, an integrated circuit chip, etc.

BRIEF DESCRIPTION OF THE DRAWINGS

FIG. 1 is a flow diagram of a method for testing a lifetime of a surface state carrier of a semiconductor of the present invention.

DESCRIPTION OF THE EMBODIMENTS

Figure 2:
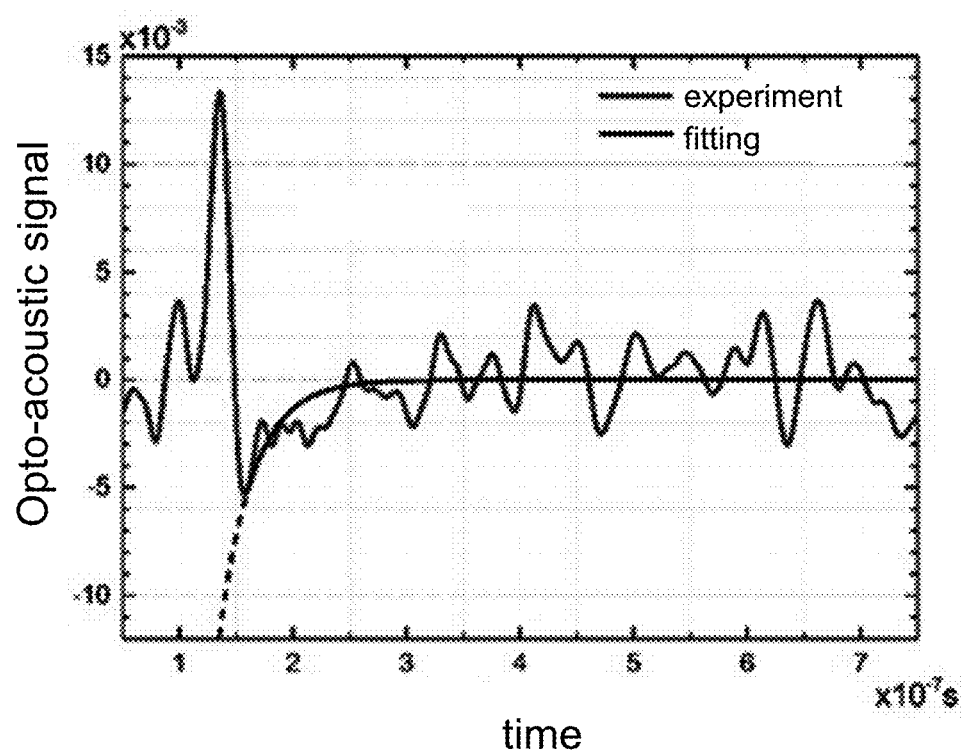
FIG. 2 is a signal of a semiconductor surface state photon-generated stress wave and a fitting result.

The present invention is described in detail with reference to the drawings and the specific embodiments below.

Embodiment 1

As shown in FIGS. 1 and 2, the present invention provides a method for testing a lifetime of a surface state carrier of a semiconductor, that is, a novel method for representing a dynamical property of a carrier in a surface state of the semiconductor, which can eliminate semiconductor bulk recombination influence, focuses on measuring the lifetime of the surface state carrier, and has great significance for a solar cell, an integrated circuit chip, etc.

Specifically, the method includes the following steps that:

1) a narrow pulse light source with photon energy higher than a semiconductor forbidden band width is used to emit a light pulse, the light pulse is coupled to an interior of a near-field optical probe through light path collimation, and near-field light excites an electron-hole pair on a surface of a semiconductor material under test, which is also called a photon-generated carrier, wherein a width of the light pulse emitted by the narrow pulse light source is femtosecond-magnitude to nanosecond-magnitude;

2) the photon-generated carrier excited in step 1) is concentrated on the surface of the semiconductor material, and recombination is conducted continuously with a surface state as a recombination center, wherein a recombination rate is in direct proportion to a carrier concentration and a carrier lifetime; the photon-generated carrier still conducts the recombination continuously after light pulse irradiation is finished, till the carrier in the semiconductor material is returned to a balance state;

3) in both carrier excitation and recombination processes in step 1) and step 2), a change in a lattice constant c is produced due to an electronic volume effect, wherein a relative change amount thereof is in direct proportion to an electron-hole pair concentration n;

$$\frac{\Delta c}{c} = \frac{dE_G}{dP} n = Q\exp\left(-\frac{t}{\tau_c}\right)$$

wherein $$\frac{dE_G}{dP}$$

is a band gap pressure coefficient, and Q is a constant coefficient; regarding silicon, the band gap pressure is a negative number (−1.4), which means that when the electron-hole pair concentration n increases, the lattice constant of the silicon decreases, and then the silicon contracts; and when the electron-hole pair concentration n decreases, the lattice constant of the silicon increases, and then the silicon expands, that is, the electronic volume effect; so when the light pulse is incident on the semiconductor material, the semiconductor material may contract and then expand due to intrinsic absorption and the electronic volume effect of the semiconductor material, so as to the pulse stress wave; a high-frequency ultrasonic transducer, a laser doppler vibrometer, or a laser interferometer which have a nanosecond resolution is used to detect the signal of the stress wave produced on the surface of the semiconductor material; and 4) according to a formula $$\frac{\Delta c}{c} = \frac{dE_G}{dP} n = Q\exp\left(-\frac{t}{\tau_c}\right),$$

fitting calculation is conducted on a trailing part of the signal of the stress wave received in step 3) to obtain the lifetime of the surface state carrier $\tau_c$.

What is claimed is:

1. A method for testing a lifetime of a surface state carrier of a semiconductor, comprising the following steps:
   1) Using a narrow pulse light source with photon energy higher than a semiconductor forbidden band width to emit a light pulse, coupling the light pulse to an interior of a near-field optical probe through light path collimation, and producing, by the near-field optical probe, a photon-generated carrier on a surface of a semiconductor material under test through excitation;
   2) Concentrating the excited photon-generated carrier on the surface of the semiconductor material, and conducting recombination continuously with a surface state as a recombination center, wherein a recombination rate is in direct proportion to a carrier concentration and a carrier lifetime;
   3) In both carrier excitation and recombination processes in step 1) and step 2), producing a change in a lattice constant due to an electronic volume effect, producing a stress wave, and detecting a signal of the stress wave in a high-frequency broadband ultrasonic testing mode; and
   4) Conducting fitting calculation on the signal of the stress wave to obtain the lifetime of the surface state carrier $\tau_c$.

2. The method for testing the lifetime of the surface state carrier of the semiconductor according to claim 1, wherein in the step 1), a width of the light pulse emitted by the narrow pulse light source is femtosecond-magnitude to nanosecond-magnitude, and is not more than 5 nanoseconds.

3. The method for testing the lifetime of the surface state carrier of the semiconductor according to claim 1, wherein in the step 1), the near-field optical probe is a near-field optical probe with a hole or a near-field optical probe without the hole, and the light pulse is coupled to an interior of the near-field optical probe with the hole or a surface of the near-field optical probe without the hole through collimation.

4. The method for testing the lifetime of the surface state carrier of the semiconductor according to claim 1, wherein in the step 1), a distance between the near-field optical probe and the surface of the semiconductor material under test is not more than 1/10 of a wave length of the light pulse.

5. The method for testing the lifetime of the surface state carrier of the semiconductor according to claim 1, wherein in the step 1), the photon-generated carrier excited by the near-field optical probe is located at a surface and a subsurface of a semiconductor under test.

6. The method for testing the lifetime of the surface state carrier of the semiconductor according to claim 1, wherein in the step 2), when the recombination of the photon-generated carrier, excited by the near-field optical probe, on the surface of the semiconductor under test is conducted, indirect recombination is conducted with the surface state as the center.

7. The method for testing the lifetime of the surface state carrier of the semiconductor according to claim 1, wherein in the step 2), the photon-generated carrier still conducts the recombination continuously after light pulse irradiation is finished, till the carrier in the semiconductor material is returned to a balance state.

8. The method for testing the lifetime of the surface state carrier of the semiconductor according to claim 1, wherein in the step 3), the signal of the stress wave of the surface of the semiconductor material is detected by means of a high-frequency broadband ultrasonic testing instrument, wherein the high-frequency broadband ultrasonic testing instrument comprises an ultrasonic transducer, a laser doppler vibrometer, and a laser interferometer which have a nanosecond resolution.

9. The method for testing the lifetime of the surface state carrier of the semiconductor according to claim 1, wherein in the step 4), fitting is conducted on a trailing part of the signal of the stress wave produced on the surface of the semiconductor material through excitation by near-field light to obtain the lifetime of the surface state carrier $\tau_c$, wherein a specific fitting formula is:

$$\frac{\Delta c}{c} = \frac{dE_G}{dP}n = Q\exp\left(-\frac{t}{\tau_c}\right)$$

wherein c is a lattice constant, $$\frac{dE_G}{dP}$$

is a band gap pressure coefficient, n is an electron-hole pair concentration, Q is a constant coefficient, and t is time.

* * * * *